United States Patent [19]

Struck et al.

[11] Patent Number: 6,040,727
[45] Date of Patent: Mar. 21, 2000

[54] DELAY DEVICE

[75] Inventors: Sönke Struck, Ney Wulmstorf; Ernst Holger, Hamburg, both of Germany

[73] Assignee: U.S. Philips Corporation, New York, N.Y.

[21] Appl. No.: 09/061,814

[22] Filed: Apr. 16, 1998

[30] Foreign Application Priority Data

May 2, 1997 [DE] Germany .............................. 197 18 617

[51] Int. Cl.[7] .................................................... H03H 11/26
[52] U.S. Cl. ......................... 327/277; 327/264; 327/278; 327/34; 327/36; 327/551; 327/554
[58] Field of Search .................................... 327/264, 277, 327/278, 34, 36, 551, 554

[56] References Cited

U.S. PATENT DOCUMENTS

| | | | |
|---|---|---|---|
| 3,731,287 | 5/1973 | Seely et al. .............................. | 327/109 |
| 4,409,612 | 10/1983 | Warmuth .................................. | 348/640 |
| 4,625,326 | 11/1986 | Kitzen et al. ............................. | 381/17 |
| 4,991,003 | 2/1991 | Sendelweck ............................. | 348/710 |
| 5,012,143 | 4/1991 | Boudewijns ............................. | 307/606 |

*Primary Examiner*—Timothy P. Callahan
*Assistant Examiner*—Cassandra Cox
*Attorney, Agent, or Firm*—Edward W. Goodman

[57] ABSTRACT

A delay device includes storage elements arranged in at least two rows 4, 5; 6, 7 in an integrated circuit, preferably in switched-capacitor technology. The delay device 2; 3 has an even number of storage elements. A first clock signal is provided from which, for producing a delay time equal to an odd multiple of the clock period of the first clock signal, a second clock signal is derived by means of a clock generation circuit 9, this second clock signal clocking the storage elements and being derived from the first clock signal in such a manner that one clock pulse of the first clock signal is suppressed in a selectable or given cycle and all the other clock pulses in the cycle are taken over in the second clock signal.

5 Claims, 2 Drawing Sheets

DELAY DEVICE

BACKGROUND OF THE INVENTION

1. Field of the Invention

The invention relates to a delay device comprising storage elements arranged in at least two rows in an integrated circuit, preferably in switched-capacitor technology.

2. Description of the Related Art

European Patent Application EP-A-0 383 387, corresponding to U.S. Pat. No. 5,012,143 discloses an integrated circuit which includes delay devices whose storage elements are implemented in switched-capacitor technology and which are arranged in a plurality of rows. In such delay devices having their storage elements arranged in a plurality of rows, a problem arises when the delay devices should produce a delay by an odd multiple of the clock period with which the signals stored temporarily in the storage elements are read out. This is because during read-out (as well as during read in,) the clock signal should alternately be applied to the rows of storage elements, in which the rows should each have the same number of storage elements. Therefore, in the case of, for example, a delay device having storage elements arranged in two rows, a delay by an odd multiple of the period of the clock signal for read-in and read-out cannot readily be obtained.

SUMMARY OF THE INVENTION

It is an object of the invention to provide a delay device of this type which solves this problem.

According to the invention, this object is achieved in that the delay device comprises an even number of storage elements, and a first clock signal is provided, and, for producing a delay time equal to an odd multiple of the clock period of the first clock signal, a second clock signal is generated by means of a clock generation circuit, this second clock signal clocking the storage elements and being generated from the first clock signal in such a manner that one clock pulse of the first clock signal is suppressed in a selectable or given cycle, and all the other clock pulses in the cycle are taken over in the second clock signal.

In the prior-art devices, read-in and read-out are effected quasi by means of the first clock signal. This clock signal has a frequency which is such that the clock period defines the desired instants at which read-in or read-out should take place. However, this gives rise to the afore-mentioned problem. Therefore, a second clock signal, which essentially corresponds to the first clock signal, is generated by means of a clock generation circuit. However, in comparison with the first clock signal, a pulse is suppressed in the second clock signal in given cycles. Such a cycle can be, for example, the duration of one picture line of a television signal to be delayed by means of the delay device. Such a line has a given duration and, as a consequence, its duration corresponds to a given number of clock pulses of the first clock signal. In the present example, this number of clock pulses designates the given cycle. In this cycle each time, one of the pulses of the first clock signal is suppressed so as to generate the second clock signal.

Thus, two goals are attained by means of the second clock signal. On the one hand, the clock period has the desired duration, i.e., the second clock signal still has the same clock period as the first clock signal by means of which the data has been read into or out of the delay device. Nevertheless, it has an odd number of clock pulses in the given cycle, so that it is achieved, within the selectable or given cycle, to generate a delay which is an odd multiple of the clock period of the first clock signal.

An embodiment of the invention has the characteristic features that a video signal is applied to the delay device and during the generation of the second clock signal, the clock generation circuit suppresses a clock pulse in the first clock signal during time intervals in which the video signal does not transmit any picture information, preferably during the blanking intervals at the beginning of the picture lines of the video signal. The clock pulse suppressed in the given or selectable cycle ensures that no signal can be read in or read out during said time intervals. Therefore, this clock pulse is preferably situated in the clock signal in such a manner that it appears in time intervals in which no picture information is transmitted.

Another advantageous embodiment of the invention has the characteristic feature that there is provided a clock generation circuit which is common to the delay devices and which supplies the second clock signal, by means of which the storage elements in both delay devices are clocked. Many filter arrangements, particularly comb filter arrangements, use a plurality of, generally two, delay devices. For such filter arrangements, the second clock signal must be generated only once. Consequently, only one clock generation circuit common to all the delay devices is required.

For example, for a comb filter arrangement by means of which the chroma signal is to be filtered out of the PAL-standard video signal reproduced by means of a video recorder, the delay devices should produce a delay corresponding to a duration of 1135 clock pulses, because this number of pulses provides an ideal comb filtering. Since this cannot be achieved by means of an even number of storage elements, the second clock signal in the present example is generated from the first clock signal with a cycle of 1135 clock pulses in such a manner that one pulse of the cycle is omitted, as a result of which the second clock signal has only 1134 clock pulses in a cycle of the same length, which is ideal for reading in or reading out the storage cells of the delay devices.

BRIEF DESCRIPTION OF THE DRAWING

An embodiment of the invention will be described in more detail, by way of example, with reference to the drawing. In the drawing.

DESCRIPTION OF THE PREFERRED EMBODIMENT

Figure 1:
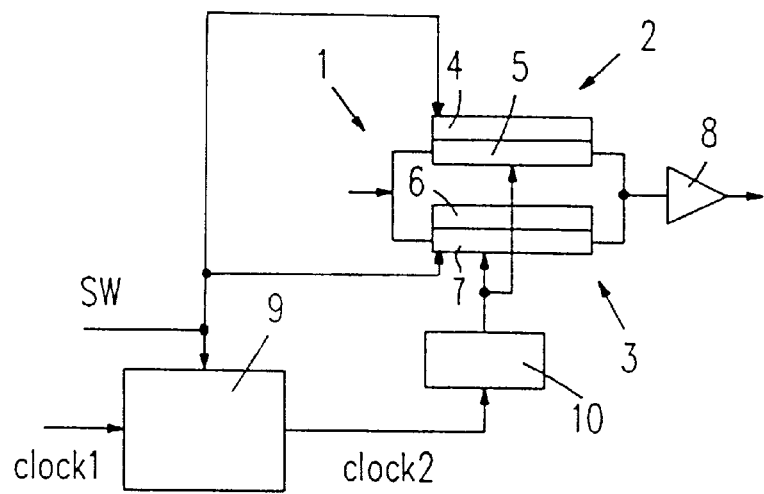
FIG. 1 shows a block diagram of a comb filter arrangement including two delay devices a clock pulse generation circuit in accordance with the invention.

FIG. 1 shows a block diagram of a comb filter arrangement 1 including two delay devices 2 and 3.

Each of the delay devices 2 and 3 comprises storage elements, not shown, arranged in two rows 4, 5 and 6, 7, respectively. The storage elements are preferably implemented in switched capacitor technology.

Figure 3:
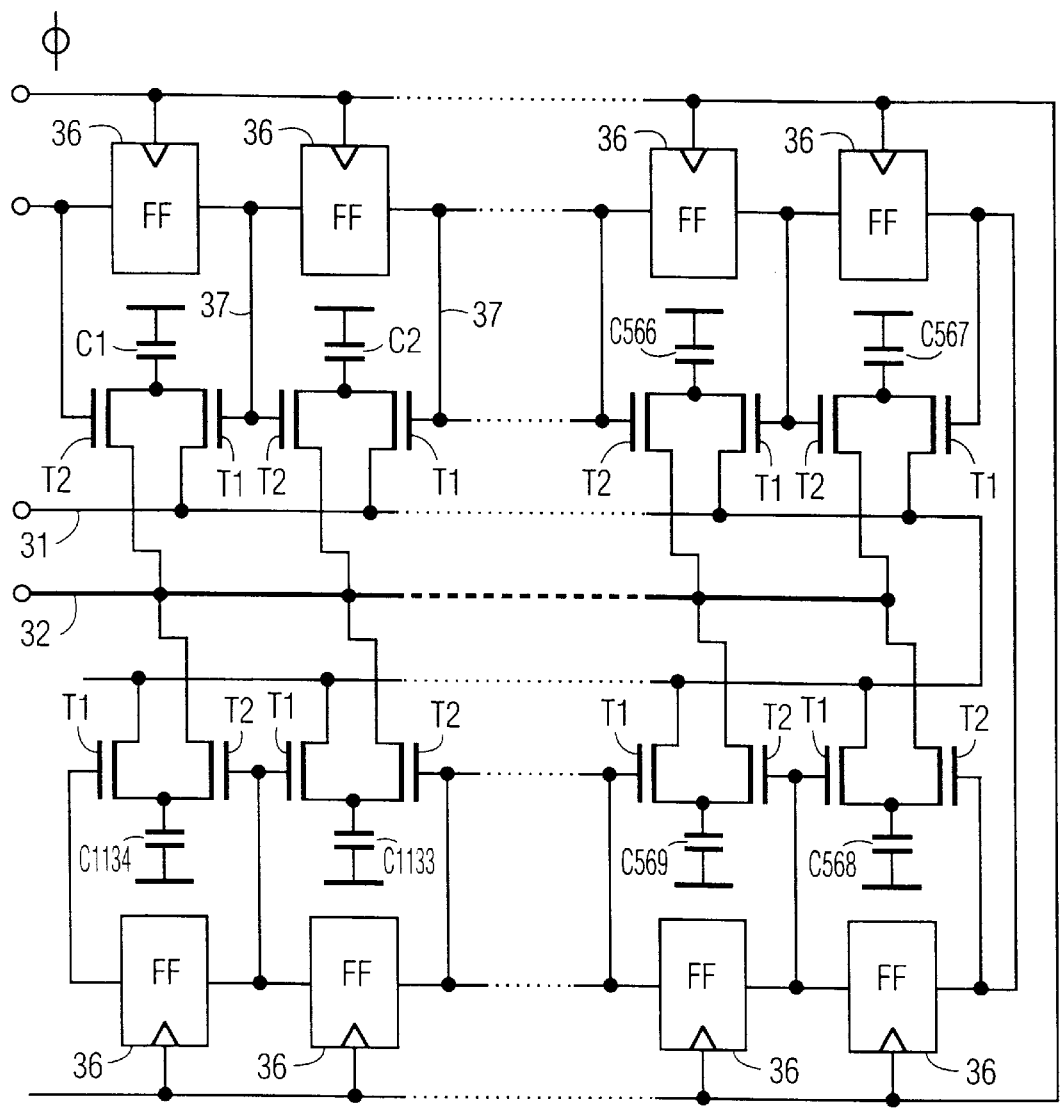
FIG. 3 shows a circuit diagram of a delay device of FIG. 1.

Each of the delay devices includes, for example, 1134 storage cells for filtering a video signal in accordance with the PAL transmission standard reproduced by means of a video recorder. FIG. 3 shows a circuit diagram of one of the delay devices 2, 3. In particular, the delay device includes 1134 storage cells in the form of capacitors C1–C1134, arranged in two rows (4, 5 and 6, 7), a first row (4, 6) including capacitors C1–C567, and a second row (5, 7) including C568–C1134. The input signal to be delayed is applied via the input line 31 and is stored on one plate (electrode) of the relevant capacitor (C1–C1134), the other plate of the relevant capacitor being connected to a reference voltage. The information-containing plates are connected via switches T1 to the input line 31 and via switches T2 to an output line 32, which is connected to the amplifier 8. The switches T1 and T2 are MOS transistors, whose source and drain electrodes constitute a current path between the information-containing capacitance plates, on the one hand, and the input and output lines 31 and 32, on the other hand. The gate electrodes of the transistors T1 and T2 are controlled by s shift register which is constructed in known manner as a circuit of dynamic flip-flops 36. The shift register (flip-flops 36) receives the signal pulse SW and transports this pulse from flip-flop to flip-flop, which correspondingly cause the sequential storage of the input signal and the sequential reading of the previously stored signal from the first storage cell (C1) to the last storage cell (C1134), the corresponding transistors T1 and T2 being sequentially rendered conductive and non-conductive through the connections 37. The transport of the pulse SW and the sequential storage of the input signal and the sequential reading of the previously stored signal is controlled by clock Φ, which is connected to the output of the clock processing circuit 10. In each case, a read-in transistor T1 of a first storage cell and the read-out transistor T2 of the next storage cell are connected by a command connection 37 to an output of the shift register (a corresponding flip-flop 36), as a result of which a storage cell is read out (reset) and the following storage cell is written into using the same signal at the connection 37, the information of the storage cell remaining stored until a new pulse SW passes the relevant connection 37.

While this delay device has 1134 storage cells, for an ideal filtering, 1135 storage cells would be more favorable. Since this cannot be realized and, moreover, the clock period, during the read-in and read-out of the individual storage cells, should not be changed, there has been provided a clock generation circuit 9 which generates a second clock signal from a first clock signal comprising clock pulses having the desired clock period. In one cycle, this clock signal has only 1134 clock pulses and is processed by means of a clock processing circuit 10 and applied to the two delay devices 2 and 3, i.e. to the storage cells arranged in the rows 4, 5 and 6, 7, respectively.

The input signal of the comb filter arrangement, which can be, for example, a video signal, is applied to the two delay devices 2 and 3 of the comb filter arrangement 1. At the output side, the two signals are combined, amplified by means of an amplifier 8, and made available as an output signal.

In the above-mentioned example, in which the signal applied to the comb filter arrangement is a PAL-standard video signal reproduced by means of a video recorder, each of the delay devices includes 1134 storage cells arranged in the two rows 4, 5 and 6, 7, respectively. The read-in and read-out processes are controlled in different ways in the two delay devices 2 and 3, in such a manner that one delay device provides a delay equal to substantially two line periods of the video signal while the other delay device provides only a very small delay. The principal function of the second delay device is therefore not to produce a delay but to process the video signal in the same way as the other delay device, so that similar amplitude errors, etc., are obtained.

In the present example of a PAL video signal, the problem arises that the delay devices can be constructed only in such a manner that they have equal numbers of storage elements in both rows. On the other hand, the read-in and read-out processes should be performed with clock pulses of a given clock period.

For this purpose, it may be necessary to use an odd number of storage elements for actual delay process. In the above-mentioned case of the PAL video signal, this would be 1135 storage elements. However, this would mean that either the two storage rows should have an odd number of storage elements, which is technologically impossible, or the frequency of the clock signal should be adapted accordingly, which is undesirable.

Therefore, a second clock signal having 1134 clock pulses per cycle is generated.

Figure 2:
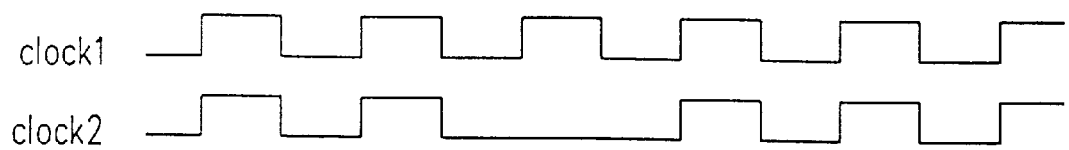
FIG. 2 shows waveforms of the first and the second clock signal for the arrangement of FIG. 1.

This will be explained hereinafter with reference to the waveform diagrams in FIG. 2.

The clock signal having the desired frequency is the first clock signal, which is referenced clock1 in both Figures. This clock signal comprises a given number of clock pulses having the desired period during a selectable or given time interval, for example, for the duration of one picture line of a video signal.

In the situation shown in FIG. 1 this clock signal is applied to the clock generation circuit 9 to derive the second clock signal clock2. The waveform diagram in FIG. 2 shows that the second clock signal essentially corresponds to the first clock signal, but that in the waveform shown in FIG. 2, one pulse has been omitted. During the generation of the second clock signal, one pulse of the first clock signal is suppressed in a given cycle of a given duration. From this, the second clock signal clock 2 is generated by means of which, after subsequent processing, the two delay devices 2 and 3 of the arrangement of FIG. 1 are clocked.

Due to this method of generating the second clock signal, it is possible to meet the requirement that a delay time, corresponding to an odd multiple of the period, should be obtained while nevertheless an odd number of storage elements in the delay devices 2 and 3 can be addressed, i.e., to read data into or out of these devices. In spite of this, if the gap is ignored, the second clock signal has a frequency or period of the desired value.

During the occurrence of the gap in the second clock signal, no signals can be read into or read out of the delay devices 2 and 3. Therefore, a switching signal SW is applied to the clock generation circuit 9 in FIG. 1, and to the delay devices 2 and 3 this switching signal, for example, in the case that a video signal is processed, occurring during the blanking interval at the beginning of each picture line, in which no picture information is transmitted. This ensures that the picture information is not affected during the "missing" pulse in the second clock signal.

By means of the invention, it is achieved that in delay devices whose storage elements are arranged in two rows an arbitrary number of storage elements, in particular, also an odd number, can be addressed. This makes it possible to obtain desired, ideal delay times.

What is claimed is:

1. A delay device comprising storage elements arranged in at least two rows in an integrated circuit, characterized in that the delay device comprises an even number of storage elements, and a clock generation circuit for receiving a first clock signal for producing a delay time equal to an odd multiple of a clock period of the first clock signal, said clock generation circuit generating a second clock signal for clocking the storage elements said second clock signal being generated from the first clock signal in such a manner that one clock pulse of the first clock signal is suppressed in a selectable or given cycle and all the other clock pulses in the cycle are taken over in the second clock signal.

2. A delay device as claimed in claim 1, characterized in that a video signal is applied to the delay device and, during the generation of the second clock signal, the clock generation circuit suppresses a clock pulse in the first clock signal during time intervals in which the video signal does not transmit any picture information, in particular, during blanking intervals at the beginning of picture lines of the video signal.

3. A filter arrangement including at least two delay devices as claimed in claim 1, characterized in that said filter arrangement comprises a single clock generation circuit in substitution for the clock generation circuits in both delay devices, said single clock generation circuit supplying the second clock signal for clocking the storage elements in both delay devices.

4. A filter arrangement as claimed in claim 3, wherein said filter arrangement is a comb filter arrangement.

5. A filter arrangement as claimed in claim 4, characterized in that, for filtering the chroma signal of a video signal in accordance with the PAL standard, the single clock generation circuit suppresses a clock pulse at a beginning of each picture line in a cycle of 1135 clock pulses of the first clock signal during the generation of the second clock signal.

* * * * *